(12) United States Patent
Busnaina et al.

(10) Patent No.: US 8,362,618 B2
(45) Date of Patent: Jan. 29, 2013

(54) THREE DIMENSIONAL NANOSCALE CIRCUIT INTERCONNECT AND METHOD OF ASSEMBLY BY DIELECTROPHORESIS

(75) Inventors: Ahmed Busnaina, Ashland, MA (US); Mehmet R. Dokmeci, Brookline, MA (US); Nishant Khanduja, Boston, MA (US); Selvapraba Selvarasah, Malden, MA (US); Xugang Xiong, Boston, MA (US); Prashanth Makaram, Boston, MA (US); Chia-Ling Chen, Boston, MA (US)

(73) Assignee: Northeastern University, Boston, MA (US)

( * ) Notice: Subject to any disclaimer, the term of this patent is extended or adjusted under 35 U.S.C. 154(b) by 167 days.

(21) Appl. No.: 12/513,925

(22) PCT Filed: Nov. 8, 2007

(86) PCT No.: PCT/US2007/023573
§ 371 (c)(1),
(2), (4) Date: May 7, 2009

(87) PCT Pub. No.: WO2008/147394
PCT Pub. Date: Dec. 4, 2008

(65) Prior Publication Data
US 2010/0038794 A1 Feb. 18, 2010

Related U.S. Application Data

(60) Provisional application No. 60/857,646, filed on Nov. 8, 2006, provisional application No. 60/857,654, filed on Nov. 8, 2006.

(51) Int. Cl.
*H01L 23/48* (2006.01)

(52) U.S. Cl. .................. 257/773; 257/E23.01

(58) Field of Classification Search ............... 257/773, 257/784, 778–781, E23.06; 977/742
See application file for complete search history.

(56) References Cited

U.S. PATENT DOCUMENTS

| 6,297,063 | B1 | 10/2001 | Brown et al. |
| 6,486,489 | B2 | 11/2002 | Watanabe et al. |
| 2003/0168964 | A1* | 9/2003 | Chen ............................ 313/495 |
| 2004/0238907 | A1 | 12/2004 | Pinkerton et al. |
| 2005/0110161 | A1 | 5/2005 | Naito et al. |
| 2005/0156157 | A1* | 7/2005 | Parsons et al. .................. 257/20 |
| 2005/0250094 | A1 | 11/2005 | Storhoff et al. |
| 2007/0096616 | A1* | 5/2007 | Han et al. ...................... 313/309 |
| 2007/0116627 | A1* | 5/2007 | Collier et al. .............. 423/447.2 |

OTHER PUBLICATIONS

Ramesh et al., "Dielectric Nanocomposites for Integral Thin Film Capacitors: Materials Design, Fabrication and Integration Issues", IEEE Transactions on Advanced Packaging, vol. 26 (1) (2003), pp. 17-24.

(Continued)

*Primary Examiner* — Hoa B Trinh
(74) *Attorney, Agent, or Firm* — McLane, Graf, Raulerson & Middleton, P.A.

(57) ABSTRACT

An assembly of nanoelements forms a three-dimensional nanoscale circuit interconnect for use in microelectronic devices. A process for producing the circuit interconnect includes using dielectrophoresis by applying an electrical field across a gap between vertically displaced non-coplanar microelectrodes in the presence of a liquid suspension of nanoelements such as nanoparticles or single-walled carbon nanotubes to form a nanoelement bridge connecting the microelectrodes. The assembly process can be carried out at room temperature, is compatible with conventional semiconductor fabrication, and has a high yield. The current-voltage curves obtained from the nanoelement bridge demonstrate that the assembly is functional with a resistance of −40 ohms for gold nanoparticles. The method is suitable for making high density three-dimensional circuit interconnects, vertically integrated nanosensors, and for in-line testing of manufactured conductive nanoelements.

15 Claims, 10 Drawing Sheets

OTHER PUBLICATIONS

Wong et al., "Bulk Carbon Nanotubes for Micro Anemometry", 4th ASME/JSME Joint Fluids Engineering Conference, Hawaii, USA (2003), 6 pgs.

Diehl et al., "Self-Assembled, Deterministic Carbon Nanotube Wiring Networks", Angew. Chem. Int. Ed., vol. 41 (2) (2002), pp. 353-356.

* cited by examiner

THREE DIMENSIONAL NANOSCALE CIRCUIT INTERCONNECT AND METHOD OF ASSEMBLY BY DIELECTROPHORESIS

CROSS REFERENCE TO RELATED APPLICATIONS

This application claims the priority of U.S. Provisional Application No. 60/857,646 filed on Nov. 8, 2006 and entitled THREE DIMENSIONAL DIELECTROPHORETIC ASSEMBLY OF GOLD NANOPARTICLES FOR NANODEVICES, and also claims the priority of U.S. Provisional Application No. 60/857,654 filed Nov. 8, 2006 and entitled, THREE DIMENSIONAL DIELECTROPHORETIC ASSEMBLY OF SINGLE-WALLED CARBON NANOTUBES FOR INTEGRATED CIRCUIT INTERCONNECTS, both of which are hereby incorporated by reference herein.

STATEMENT REGARDING FEDERALLY SPONSORED RESEARCH

The invention was made with support from Grant NSF-0425826 from the National Science Foundation Nanoscale Science and Engineering Center, Contract FA8718-06-C-0045 from the Air Force Research Laboratory, and Grant NER-0608892 from the National Science Foundation. The United States Government has certain rights in the invention.

FIELD OF THE INVENTION

The invention relates to nanotechnology. More specifically, the invention relates to three-dimensional nanoscale connections for an electrical circuit.

BACKGROUND OF THE INVENTION

Nanoscience, or developing and fabricating materials at a very small scale (<100 nm), is seeing exciting developments [1-3]. However, the translation of this new science into the commercial marketplace (nanotechnology) is lagging due to various reasons. One of the main reasons is the lack of innovation in the integration of nanocomponents into microdevices. In addition, similar to the progress in multi-level interconnects and 3D packaging, if nanocomponents could be integrated in a three-dimensional high density manner, this approach would be a major contribution to the field of nanotechnology. There have been several efforts to achieve nanoassembly in 3D [4]. Kreupl and co-workers [5] have demonstrated catalyst-based CVD growth of multi-walled carbon nanotubes in vias and contact holes, yet their process requires elevated temperatures (>500° C.) and is only applicable to carbon nanotubes. Amlani [6] and Kretschmer [7] have assembled gold nanoparticles between two gold microelectrodes using dielectrophoresis (DEP) but only on a flat, two-dimensional surface. Approaches that have been used for controlled manipulation of nanoparticles include template-directed synthesis, atomic and scanning force microscopy and nanorobotic manipulations. However, these methods have low throughput and are not suitable for the production environment. Therefore, there is a need to develop high throughput methods and devices for carrying out the assembly of nanoelements into three-dimensional structures that form electrical interconnects on the nm to µm scale. Such methods and devices should be compatible with the production of microcircuits, microdevices, and nanomachines.

SUMMARY OF THE INVENTION

The invention relates to nanoscale connections in three-dimensions for an electrical circuit and methods of making such connections. Circuit interconnects are rapidly assembled from a liquid suspension of nanoelements on a large scale by dielectrophoresis. An electric field established between conductive elements of a circuit that are offset from one another in a three-dimensional arrangement drives the assembly of nanoelements to form a nanobridge across a gap between the conductors. The circuit interconnect thus formed can function as a nanowire, a nanoresistor, a nanocapacitor, or a nanotransistor, and can be used as part of an integrated circuit, a logic device, a sensor, an emitter, or other device.

One aspect of the invention is a nanoscale three-dimensional circuit interconnect. The interconnect includes first and second microelectrodes in a non-coplanar (e.g., vertically displaced) arrangement. An electrically conductive bridge is attached at a first end of the bridge to the first microelectrode and is attached at a second end of the bridge to the second microelectrode. The bridge is composed essentially of an assembly of nanoelements, such as nanoparticles, nanotubes, or nanowires that have self assembled in a dielectrophoretic process under the influence of an electric field imposed between the microelectrodes.

Another aspect of the invention is a microfabricated structure that includes a three-dimensional nanoscale circuit interconnect. The structure contains at least two microelectrodes that are at least in part non-coplanar and separated by a gap. At least one nanoelement bridge, or assembly, connects the electrodes across the gap. In some embodiments the structure is an integrated circuit, a logic device, a sensor, or an emitter.

Yet another aspect of the invention is a method of fabricating a three-dimensional nanoassembly. As a first step, a microfabricated structure is provided that contains at least a first and a second microelectrode arranged in a non-coplanar arrangement, e.g., vertically displaced from one another, and having their conducting surfaces separated by a gap in the range of 200 nm to 2000 nm at their point of closest approximation. At least a portion of the structure including the gap is covered by a liquid suspension of nanoelements. A voltage is established between the first and second microelectrodes, thereby establishing an electric field through the liquid suspension across the gap and leading to dielectrophoretic assembly of nanoelements from the suspension. In some embodiments the method further includes encapsulating the bridge in a non-conductive material for stability and/or to improve performance.

A further aspect of the invention is a micromachined platform for the dielectrophoretic assembly of a three-dimensional nanoelement circuit interconnect. The platform includes a non-conductive substrate, a first conducting layer deposited on the substrate, a dielectric layer deposited on a portion of the first conducting layer, and a second conducting layer deposited on the dielectric layer. The second conducting layer is situated in a vertically displaced, non-coplanar arrangement with respect to the first conducting layer, and the second conducting layer overlaps with at least a portion of the first conducting layer, providing a gap between a conducting surface of the first conducting layer and a conducting surface of the second conducting layer. The gap, which can function as a zone of nanoelement assembly when the platform is used for dielectrophoresis, is in the range of about 200 to 2000 nm.

DESCRIPTION OF THE DRAWINGS

Other features and advantages of the present invention will be apparent from the following detailed description of the invention, taken in conjunction with the accompanying drawings of which:

FIG. 3 shows scanning electron micrographs of overlapping microelectrodes connected by three-dimensional nanoscale circuit interconnects.

FIG. 9 shows the effect of assembly voltage on the density of nanotube bundles in a three-dimensional circuit interconnect.

FIG. 10 shows the temperature sensitivity of three-dimensional SWNT thermal sensors.

DETAILED DESCRIPTION OF THE INVENTION

The inventors have discovered that dielectrophoresis can be employed to direct the assembly of nanoelements into a three-dimensional bridge that physically and electrically links conductive elements of a microcircuit. The method produces nanoscale circuit interconnects between two or more non-coplanar sites of a microelectronic component or device and can be used, for example, in the fabrication of integrated circuits, chips, logic devices, nanoscale semiconductor devices, nanomachines, sensors, and field emitters. A nanoscale circuit interconnect according to the invention can be assembled from a wide variety of nanoelements, such as nanoparticles, nanotubes, or nanowires. The interconnects are stable and of low resistance. They can be prepared from nanoelements that are conducting, semi-conducting, or non-conducting. The method is capable of forming interconnects at exposed conductive elements that are proximately arranged in three-dimensions. Further, the method can form such interconnects over a large area within seconds to minutes at room temperature, making it especially suitable for use in mass production of integrated circuits and other devices.

Figure 1:
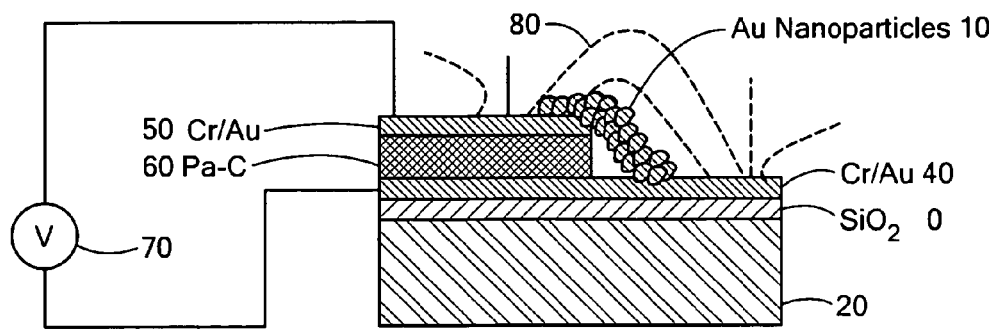
FIG. 1 shows a schematic representation of a device for making a three-dimensional nanoscale circuit interconnect by assembly of nanoparticles using dielectrophoresis.
Figure 2:
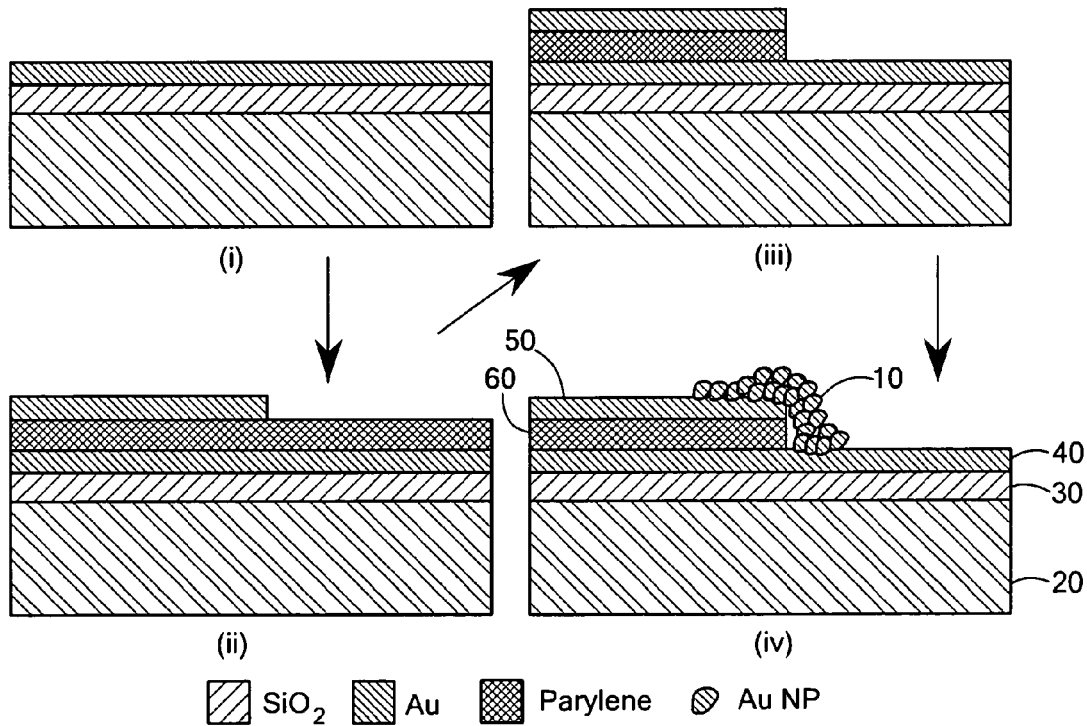
FIG. 2 depicts a process for microfabricating a layered structure containing vertically displaced microelectrodes for assembly of a three-dimensional bridge of nanoparticles.

In order to assemble a three-dimensional nanoelement bridge across the gap between vertically displaced conductive layers, an innovative micromachined platform was prepared. With reference to FIG. 1, the platform contains a nonconductive substrate layer 20, which is covered with an oxide layer 30. The substrate layer can be of any nonconducting material, such as silicon or silicon dioxide. The oxide layer 30 is a material suitable for adhesion to both the substrate layer 20 below it and the first conductive layer 40 above it. For example, the oxide layer can be composed of silicon dioxide. First conductive layer 40 (also referred to herein as the first microelectrode) contains a thin adhesion layer (not shown), such as a 15 nm to 50 nm thick layer of Cr. A thicker layer of conductor is added above the adhesion layer; for example, the conductor can be a 100 nm to 200 nm layer of Au. The conductive layers can be deposited by any of several well established methods, e.g., magnetron sputtering, RF sputtering, E-beam evaporation, or thermal evaporation. In addition to Cr/Au, any conductive metal or combination of conductive metals can be used which is suitable for the particular application; for example, tungsten, ruthenium, titanium, aluminum, copper, or any combination thereof could be used in constructing the first and/or second conductive layers. The first conductive layer can be patterned as desired according to the intended application using, for example, a lift-off process such as described in "The Physics of Microfabrication" by I. Brodie and J. J. Muray, Plenum Press, New York, 1982. A thin dielectric layer 60 is then deposited onto the first conductive layer. The thickness of the dielectric layer determines the size of the gap separating the conductive layers and therefore is chosen as required by the application. A suitable dielectric material is parylene-C, which can be deposited at room temperature. Deposition of parylene can be carried out by a chemical vapor deposition method; other dielectric materials like silicon dioxide or silicon nitride can be deposited by plasma enhanced chemical vapor deposition. The thickness of the dielectric layer is preferably at least 200 nm, or in the range of about 200 nm to about 10,000 nm, more preferably about 500 to about 1000 nm, or about 700 nm. A second conductive layer 50 (also referred to herein as the second microelectrode) is then deposited and patterned as desired according to the application in a manner similar to the first conductive layer. The second conductive layer can be used as a mask, and the exposed dielectric layer can be etched away, leaving the dielectric layer in the space between the overlap region of the first and second microelectrodes. Parylene-C, for example, can be etched using $O_2$ gas in an inductively coupled plasma (ICP) reactor. FIG. 2 depicts the process of adding the first microelectrode layer to form structure (i), then the dielectric layer to form structure (ii), adding the second microelectrode layer to form structure (iii), and finally assembling the nanoelement bridge (10) to form the completed circuit interconnect, structure (iv).

The micromachined platform just described has two exposed microelectrodes in a non-coplanar arrangement, separated by a vertical spacing filled with dielectric material in the region of overlap between the electrodes. As used herein, the terms "vertical" or "vertically displaced" refer to the displacement between two conductive layers in a third dimension which is approximately perpendicular to the two dimensions of one or both of the conductive layers. Such conductors are typically planar, at least in part, as the result of their formation by a deposition process whereby a layer of conducting material is deposited on an underlying layer. As used herein, the term "non-coplanar" refers to the arrangement whereby two non-coplanar structures, such as the first and second microelectrodes, are the result of deposition of conductive material in two separate planes. The non-coplanar first and second conductive layers of the micromachined platform are generally parallel and do not intersect, but their planes can be non-parallel, at least in part, in certain applications. The first and second conductive layers are not in electrical contact except across the gap at their point of closest approximation, where a nanoelement bridge is assembled during dielectrophoresis, and except through a voltage source used to drive electrophoresis. Once a completed circuit interconnect according to the invention is installed in a device or a circuit, the first and second microelectrodes can be in electrical contact with other circuit elements.

Referring again to FIG. 1, a liquid suspension of nanoelements, e.g., an aqueous suspension, is added to cover the region of the substrate containing the microelectrodes, in particular to cover the gap between the exposed portions of the microelectrodes. Attaching function generator 70 and establishing electric field 80 between the exposed surfaces of the two microelectrodes leads to dielectrophoretic assembly of nanoelements from the suspension to form nanoelement bridge 10. A liquid suspension of nanoelements is preferably an aqueous suspension or solution including water, dispersed nanoelements, and optionally one or more buffers, salts, organic molecules, or solvents. The pH of the suspension can be adjusted as desired. For example, the pH can be adjusted to any value in the range of 4 to 11, either by the addition of an acid, a base, or a buffer. Preferably, the liquid suspension avoids any component or condition that would cause aggregation, denaturation, or decomposition of the nanoelements intended for assembly.

Figure 4:
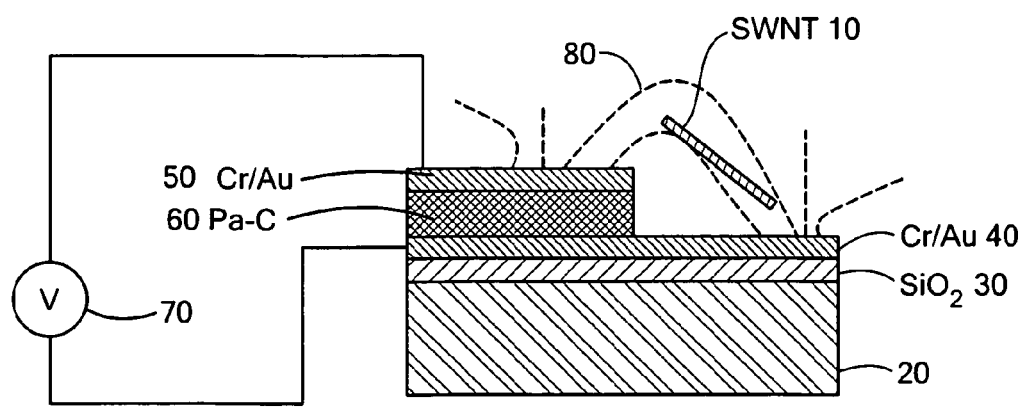
FIG. 4 shows a schematic representation of a device for making a three-dimensional nanoscale circuit interconnect by assembly of nanotubes using dielectrophoresis.
Figure 5:
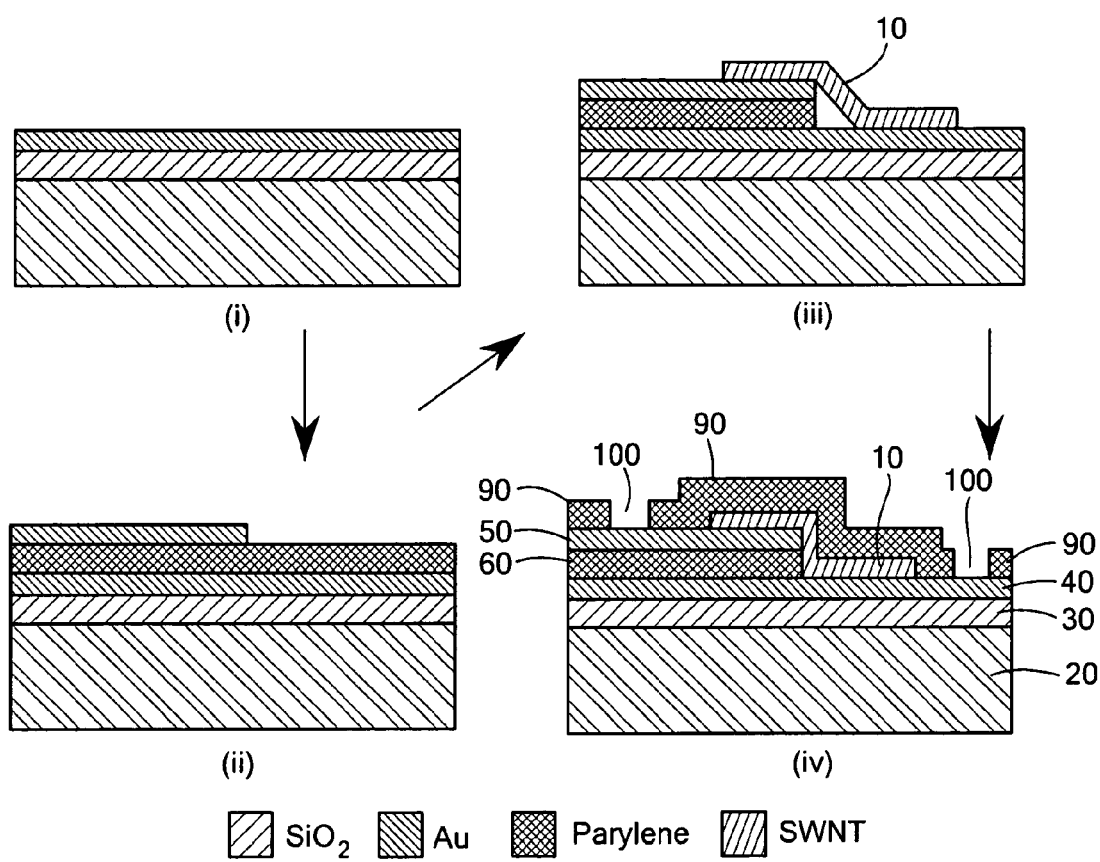
FIG. 5 depicts a process for microfabricating a layered structure containing vertically displaced microelectrodes for assembly of a three-dimensional bridge of nanotubes.

FIG. 4 depicts a micromachined platform for the assembly of a nanoelement bridge from single-walled carbon nanotubes (SWNT). The layers of the platform are similar to those shown in FIG. 1 for the assembly of nanoparticles. SWNT align with the electric field along their longitudinal axis and form parallel nanotube bundles that adhere at one end to the first microelectrode and at the other end to the second microelectrode (see FIGS. 6A-6D), each bundle establishing an electrical link similar to a nanowire. FIG. 5 illustrates the process of microfabricating a platform for the assembly depicted in FIG. 4. Structures 4(i), 4(ii), and 4(iii) are similar to the corresponding structures shown in 2(i), 2(ii), and 2(iii). To form structure 4(iv), upper encapsulating layer 90 made of insulating material, e.g., Parylene-C, has been added and etched at appropriate locations 100 to provide electrical contact with the microelectrodes for testing or attachment to a circuit or incorporation into a microdevice. The encapsulating layer stabilizes the nanotube assembly and provides protection from the environment.

Nanoelements used for assembly into a nanoelement bridge in a circuit interconnect according to the invention can be any nanoscale materials capable of self-assembly in a dielectric field, for example, nanocrystals, dendrimers, nanoparticles, nanowires, biological materials such as proteins or nucleic acids, and organic nanotubes. Preferred nanoelements are metallic single walled carbon nanotubes and metallic nanoparticles such as Au nanoparticles. Nanoparticles can have an aspect ratio of approximately one, and in some embodiments can be approximately spherical. Depending on the desired application, nanoelements can be conducting, semi-conducting (e.g., to form a nanotransistor), or non-conducting (e.g., to form a gate dielectric for fabricating a field effect transistor).

While not intending to limit the invention to any particular mechanism, assembly of nanoelements during dielectrophoresis appears to involve the formation of an induced dipole in each nanoelement by the electric field, and the movement of the nanoelement in the field as determined by the interaction of the dipole with the field. Dielectrophoresis is a simple method which utilizes an electric field to set up a dielectrophoretic force that attracts nanocomponents into gaps where the gradient of the electric field is maximum [8].

Dielectrophoresis refers to the exertion of force on the induced dipole moment of nanomaterials suspended in insulating dielectric liquids by a nonuniform AC or DC electric field. The direction of the dielectrophoretic force depends on the electrical properties of both the nanomaterials and the suspending medium, which is given in Eqns. (1) and (2) for the case of AC signals [8]:

$$\langle F_{DEP}(t) \rangle = 2\pi a b^2 \varepsilon_m Re(K) \nabla |E_{rms}|^2 \quad (1)$$

$$K = \frac{\varepsilon_p^* - \varepsilon_m^*}{3[\varepsilon_m^* + (\varepsilon_p^* - \varepsilon_m^*)L_{//}]} \quad (2)$$

where Erms is the electrical field, a and b are the length and radius of the nanomaterials, and $\in m$ and $\in p$ represent permittivity of the nanomaterials and the medium, respectively. K, the Clausius-Mosotti factor, shows the interrelationship between the frequency-dependent properties of the nanomaterials and the medium. When Re(K) is greater than 0, the assembly process is achieved through a positive dielectrophoretic force (PDEP). During PDEP assembly nanomaterials are attracted to regions where the electric field strength is highest. Alternately, for negative dielectrophoretic force (NDEP) assembly, the nanomaterials are attracted to the regions of lowest field strength. PDEP is preferred for the assembly of nanoelement bridges in the circuit interconnects of the invention.

EXAMPLES

Example I

Fabrication of a Platform Containing Microelectrodes for Assembly of a Nanoelement Interconnect This example demonstrates the use of a self-aligned two mask process from micromachining to produce a microstructure containing microelectrodes which are offset in three dimensions. Parylene-C was used as the inter-level dielectric layer.

A micromachined platform was fabricated using a simple two mask self-aligned process. A schematic of the fabrication process is illustrated in FIG. 2. The process began by growing a 1 μm thick isolation oxide layer on a 3 inch silicon wafer followed by the deposition and patterning of the first metal layer using the lift-off technique (FIG. 2(*i*)). A 400 Å adhesion layer of Cr was first deposited, followed by a 1500 Å conductive layer of Au; these layers were deposited by magnetron sputtering. Then, a 0.7 µm pin-hole free parylene-C dielectric layer was deposited on the wafer at room temperature. The second metal layer (Cr/Au-400 Å/1500 Å) was then deposited onto the parylene-C layer. As before, a 400 Å layer of Cr was deposited, followed by a 1500 Å layer of Au. The second metal layer was then patterned using lift-off (FIG. 2(*ii*)). In some cases both Cr adhesion layers were about 200 Å thick instead of 400 Å thick. The two metal layers served as the electrodes to assemble nanoelements into a circuit interconnect using DEP. By using the second metal layer as a mask (in a self-aligned manner), the parylene-C layer was etched in an inductively coupled plasma (ICP) using $O_2$ in a Plasmatherm 790 apparatus (FIG. 2(*iii*)).

The second metal layer was cut using photolithography into one or more finger-shaped electrodes (see FIG. 3A), each having a width of 2 µm and overlapping with the first metal layer for a length of 3 µm. The vertical spacing between the electrodes was determined by the thickness of the parylene-C layer, which in this case was 0.7 µm, which was suitable for assembling nanoelements of 50 nm diameter.

Example II

Assembly of a Nanoparticle Interconnect

Commercially available Au nanoparticles (Ted Pella, Inc., Redding, Calif.) were suspended in deionized water at a concentration of $4.5 \times 10^{10}$ particles/ml. The average diameter of the Au nanoparticles was 52 nm. A droplet (2-3 µl) of the nanoparticle suspension was dispensed onto the micromachined platform of Example I containing microelectrodes. An AC voltage of 8V p-p (peak-to-peak) with a frequency of 1 MHz was applied between the two electrodes through a function generator (Agilent 33220A) at room temperature to drive the assembly of the nanoparticles between the electrodes. After 5 minutes of assembly, the sample was blow-dried with nitrogen gas and the power was turned off, resulting in 3D assembled Au nanoparticles (FIG. 2(*iv*)).

Figure 3A:
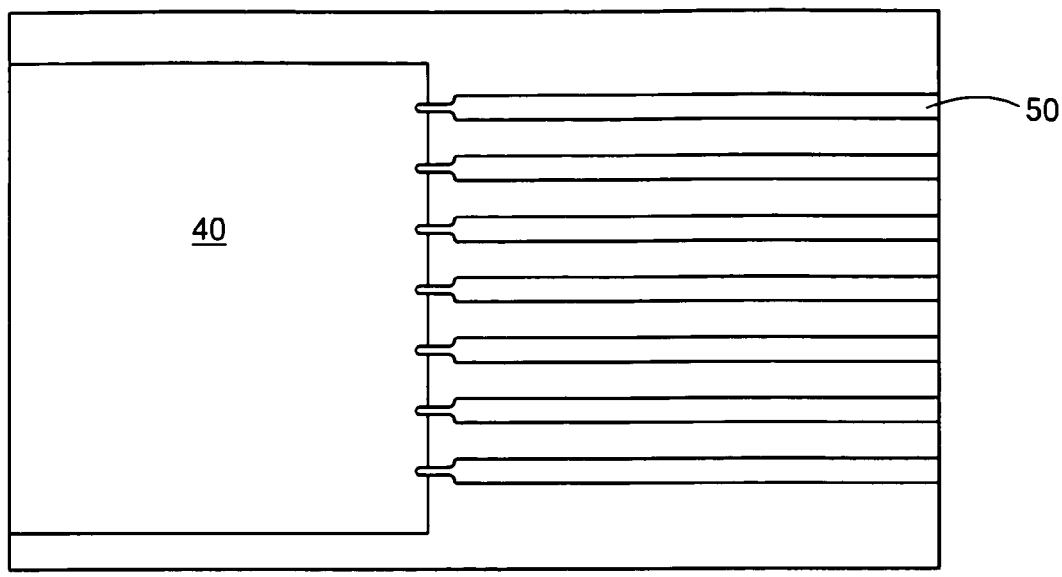
FIG. 3A is a low magnification view showing a first, basal microelectrode layer (rectangular metallic layer) overlapped by a second, upper microelectrode layer that forms a series of fingerlike projections whose tips overlap the first microelectrode layer.
Figure 3B:
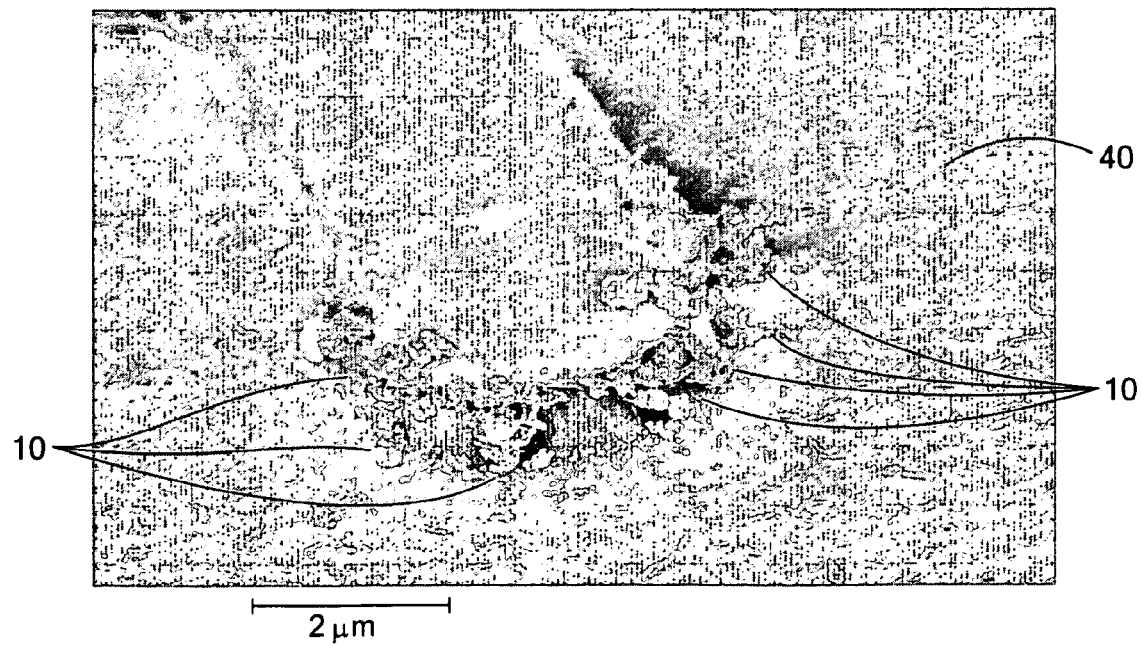
FIG. 3B is a high magnification view of a single overlap region between the first and second microelectrode layers, showing several nanoparticle bridges connecting the two microelectrodes.
Figure 3C:
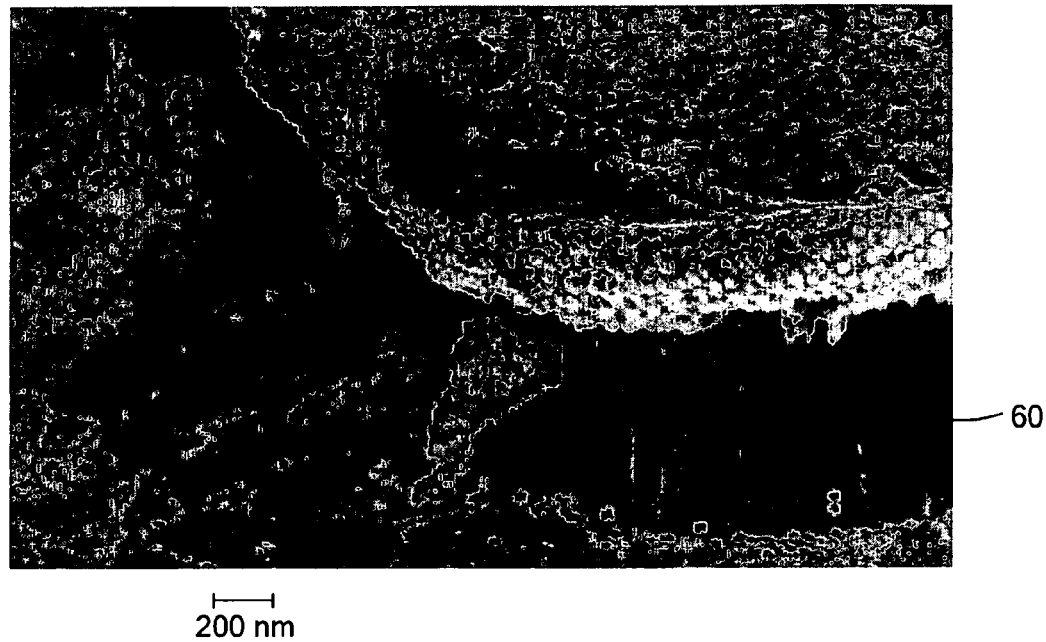
FIG. 3C is a higher magnification view showing a single nanoparticle bridge connecting the two microelectrodes.

The two terminal resistance of the 3D nanoparticle bridge was measured to be ~40 Ohms. FIG. 3A shows an optical image of one set of assembly structures. The finger structure has a 2 µm assembly tip width with an overlap of about 3 µm with the second metal layer. FIG. 3B shows an SEM micrograph of the 3D assembled gold nanoparticles and FIG. 3C shows a close-up of the assembled area. The observed large globular structures are possibly due to the melting of the nanoparticles due to current heating after a path is formed between the two electrodes [7].

Figure 7A:
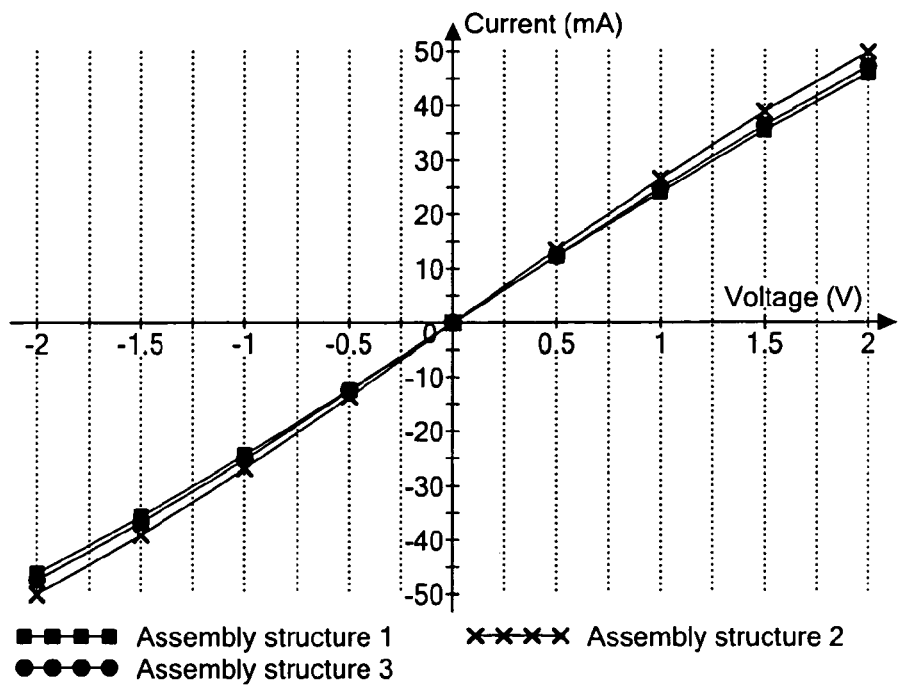
FIG. 7 shows I-V curves for three-dimensional nanoscale circuit interconnects; the curves in FIG. 7A are for three different Au nanoparticle interconnects, and the curves in FIG. 7B are for a three-dimensional interconnect formed of carbon SWNT before (+) and after (squares, circles) encapsulation in parylene-C.

The current-voltage (I-V) characteristics were measured to verify that assembly was successful. The output curves are illustrated in FIG. 7A for three different assemblies.

Example III

Assembly of a Thermal Sensor with Single-Walled Carbon Nanotubes

Figure 6A:
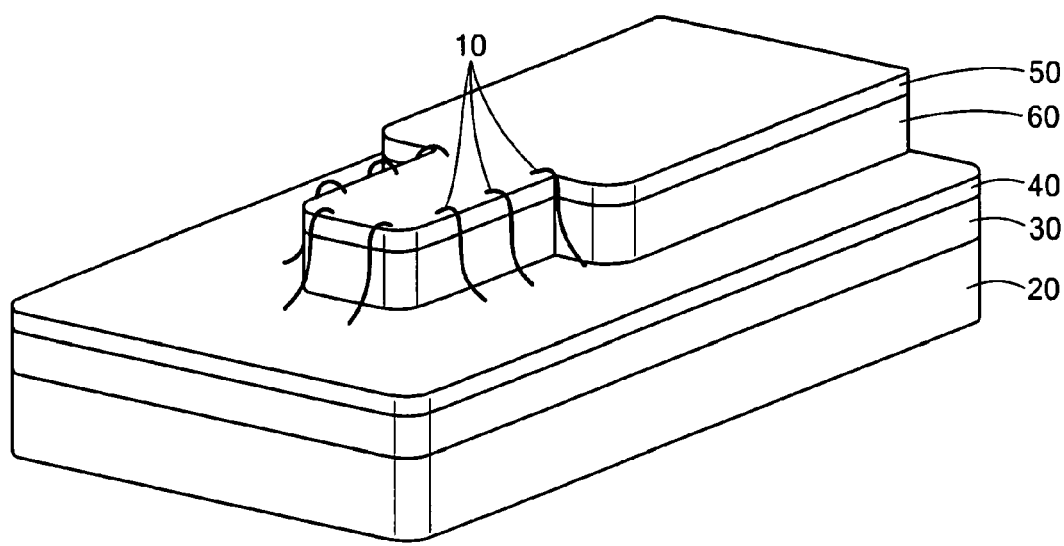
FIG. 6A is a schematic representation of a three-dimensional nanoscale circuit interconnect in which two vertically displaced conductive layers are connected by a series of nanotubes.
Figure 6B:
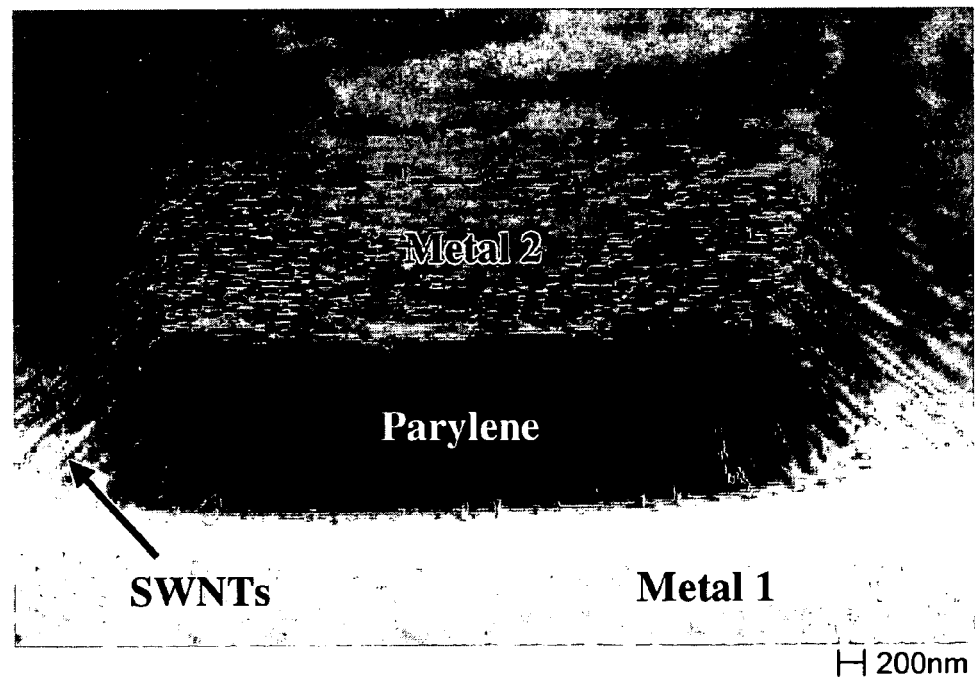
FIG. 6B is a scanning electron micrograph showing a three-dimensional nanoscale circuit interconnect in which two metal layers separated by an insulating layer are bridged by parallel bundles of nanotubes.
Figure 6C:
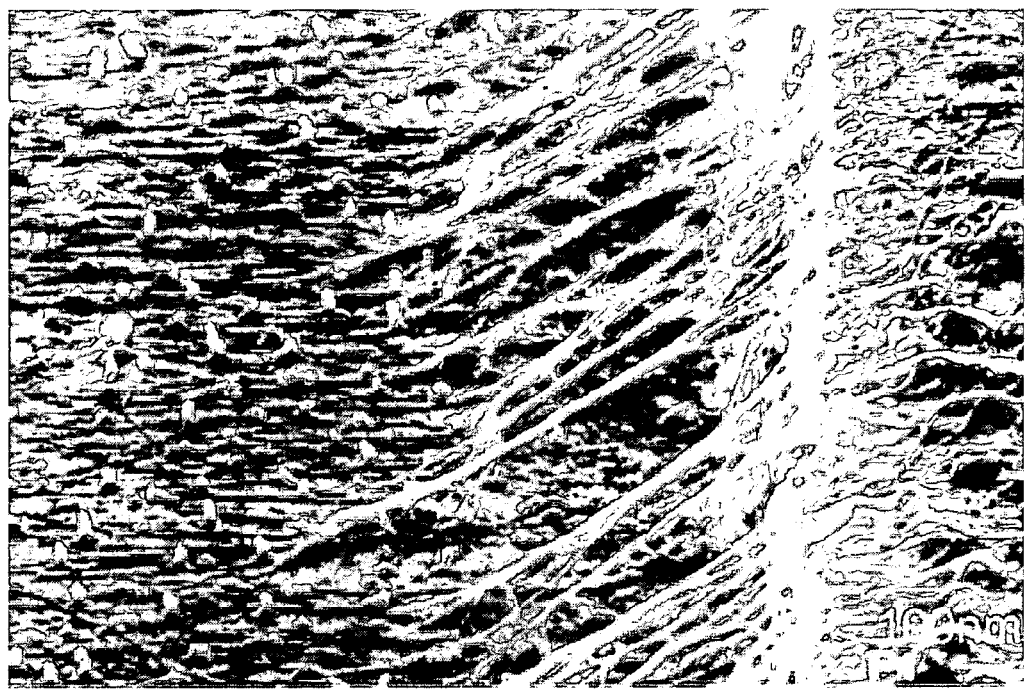
FIG. 6C is a scanning electron micrograph of the structure in FIG. 6B showing a close-up side view of the nanotube bundles interconnecting the two metal layers.
Figure 6D:
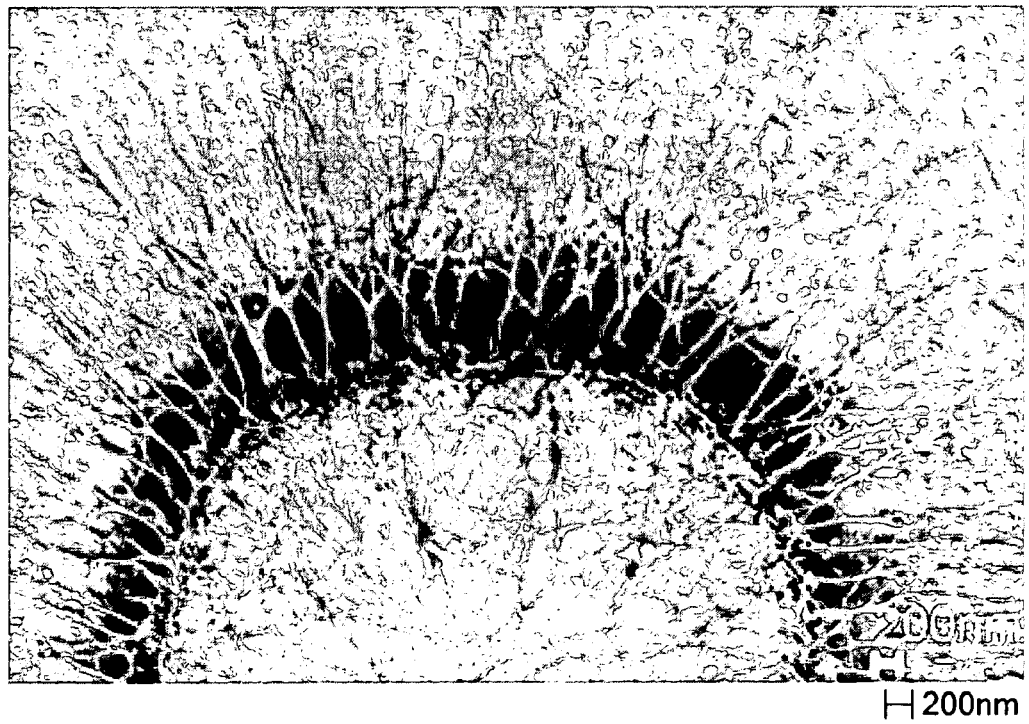
FIG. 6D is a scanning electron micrograph of the structure in FIG. 6B showing a close-up top view of the nanotube bundles interconnecting the two metal layers.

Commercially available SWNTs suspended in an aqueous solution were used as the active layer for the thermal sensor, which was formed upon a micromachined structure according to Example I. The nanotubes had been grown by chemical vapor deposition (CVD), purified, and dispersed in aqueous suspension. The average diameter of the SWNTs was 2 nm and the average length was 3 µm. The SWNT were diluted with deionized water to a concentration of 1 mg/ml and the pH was adjusted to 8 by addition of ammonium hydroxide. The DEP assembly was achieved by applying 10V and 5V peak-to-peak AC voltage at a constant frequency of 10 MHz at room temperature. Prior to the assembly process, the SWNT suspension was ultrasonicated for 5 minutes to ensure that the suspended SWNTs were well dispersed. After the AC voltage was applied to the assembly electrodes, a droplet (2-3 µl) of the SWNT suspension was dispensed on top of the assembly area. Following 30 seconds of assembly, the sample was blow-dried using 5 psi nitrogen and the power was turned off, resulting in an assembled vertical nanotube bridge between the electrodes. FIG. 6A shows a schematic diagram of the assembled thermal sensor. FIGS. 6B, 6C, and 6D show SEM micrographs of the 3D assembled SWNT bundles connecting top and bottom electrodes.

Figure 10A:
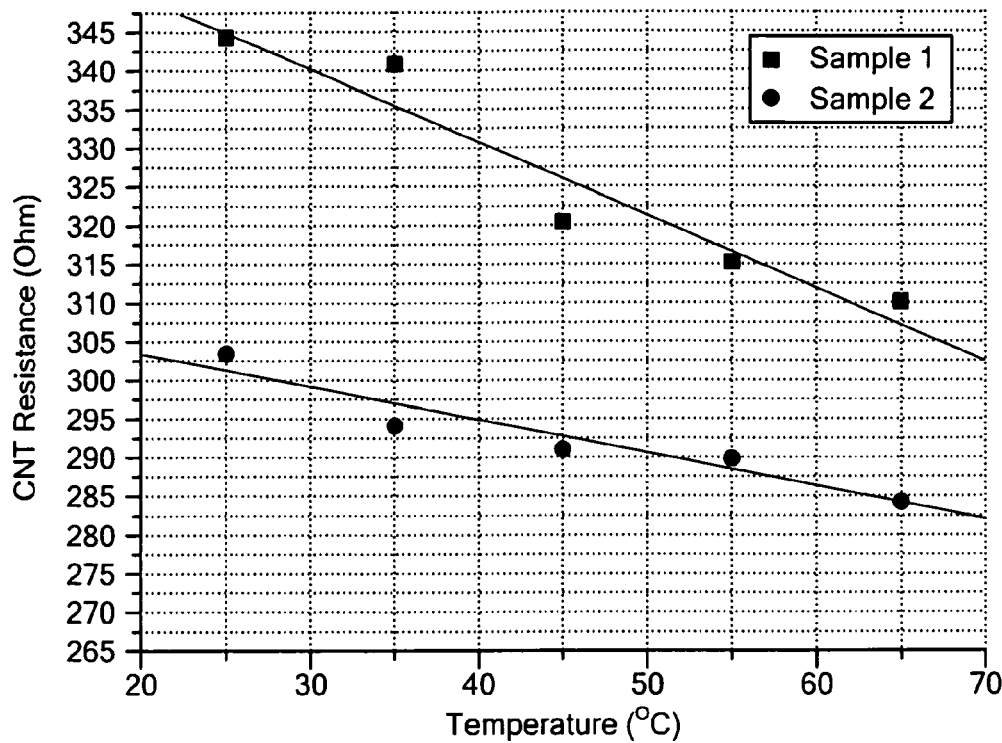
FIG. 10A shows the temperature dependence of resistance for two different single finger electrode sensors.
Figure 10B:
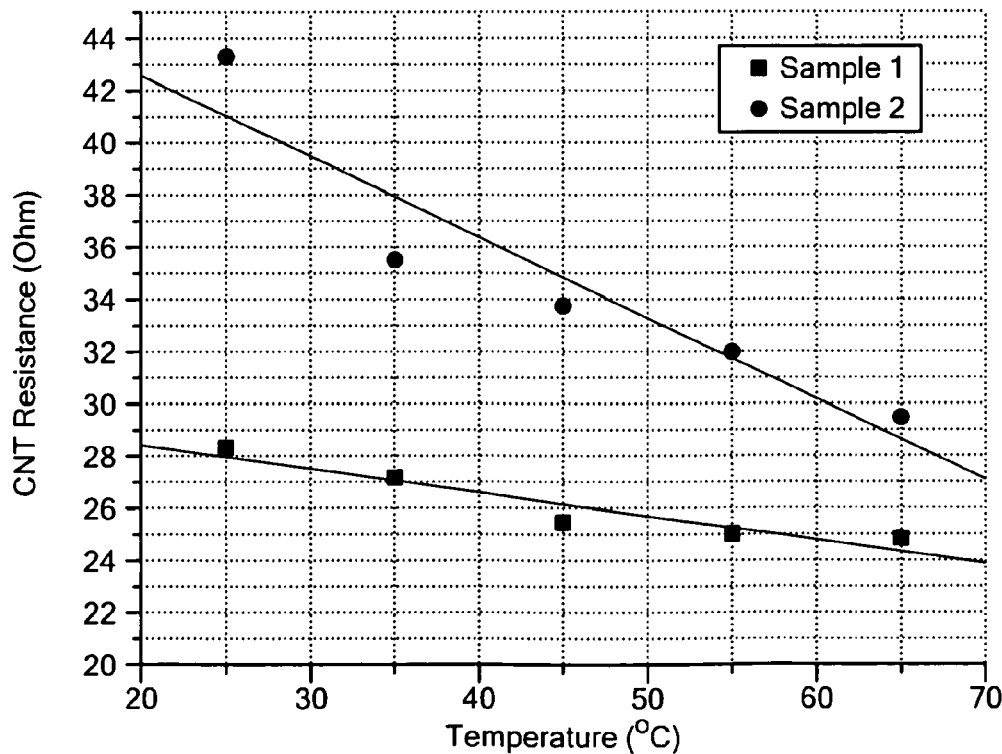
FIG. 10B shows the temperature dependence of resistance for two different multi-finger electrode sensors.

SWNTs are sensitive to temperature, and their resistance drops with increasing temperature. To investigate the effect of temperature on SWNTs, the 3D thermal sensor was placed on a SUSS PM5 analytical probe system with a heatable chuck. The change in resistance was measured as a function of temperature. The temperature was varied from 25° C. to 65° C. with 10° C. increments. FIGS. 10A and 10B display the measured temperature response from the single and multifinger thermal sensors, respectively. As the temperature was increased from 25° C. to 65° C., the resistance values in both cases drop more than 10%. The calculated temperature coefficient of resistance (TCR) value from the single electrode device varied from −0.154 to −0.24%, whereas the TCR of the multielectrode sensor varied from −0.3 to −0.57%. Comparing the data with the previously reported 2D thermal sensors made of MWNTs [4-5], a two-fold higher thermal sensitivity was achieved.

Example IV

Altering the Density of Nanotube Bundles in a Thermal Sensor

Figure 8:
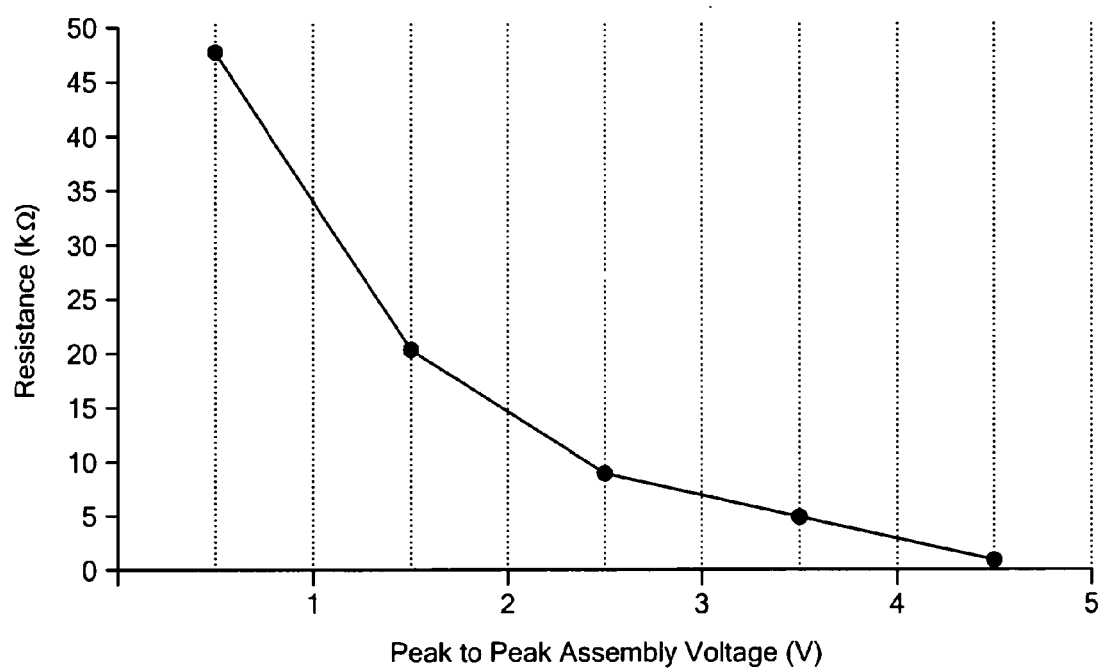
FIG. 8 shows the relationship between the resistance of a single-walled carbon nanotube circuit interconnect and the AC peak-to-peak assembly voltage.
Figure 9A:
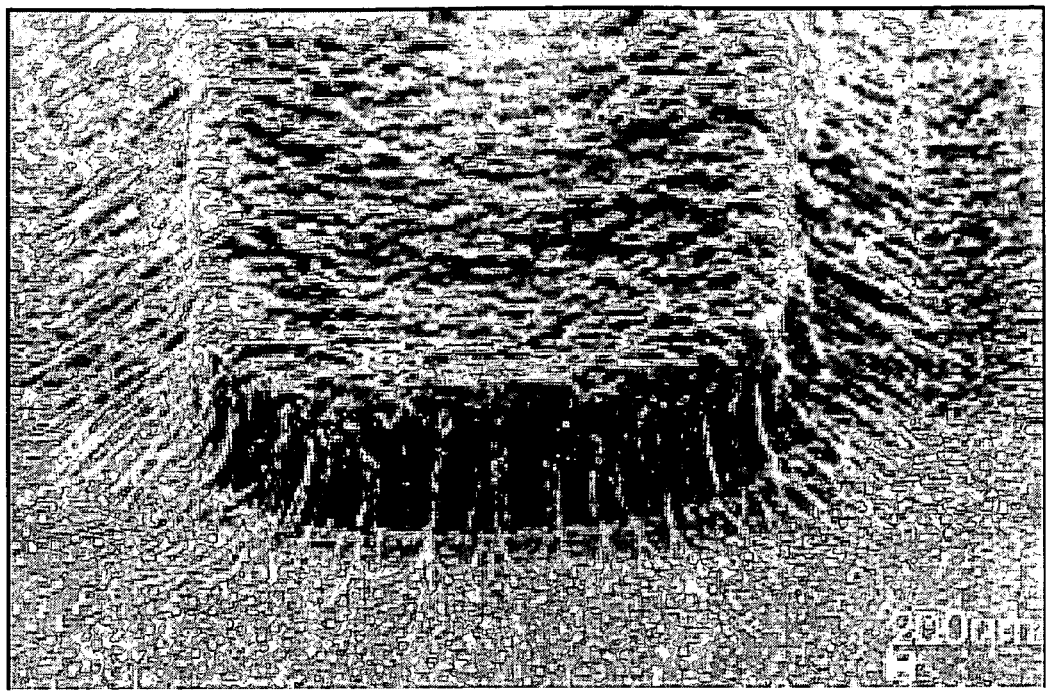
FIG. 9A is a scanning electron micrograph of a nanotube interconnect assembled at 10V p-p.
Figure 9B:
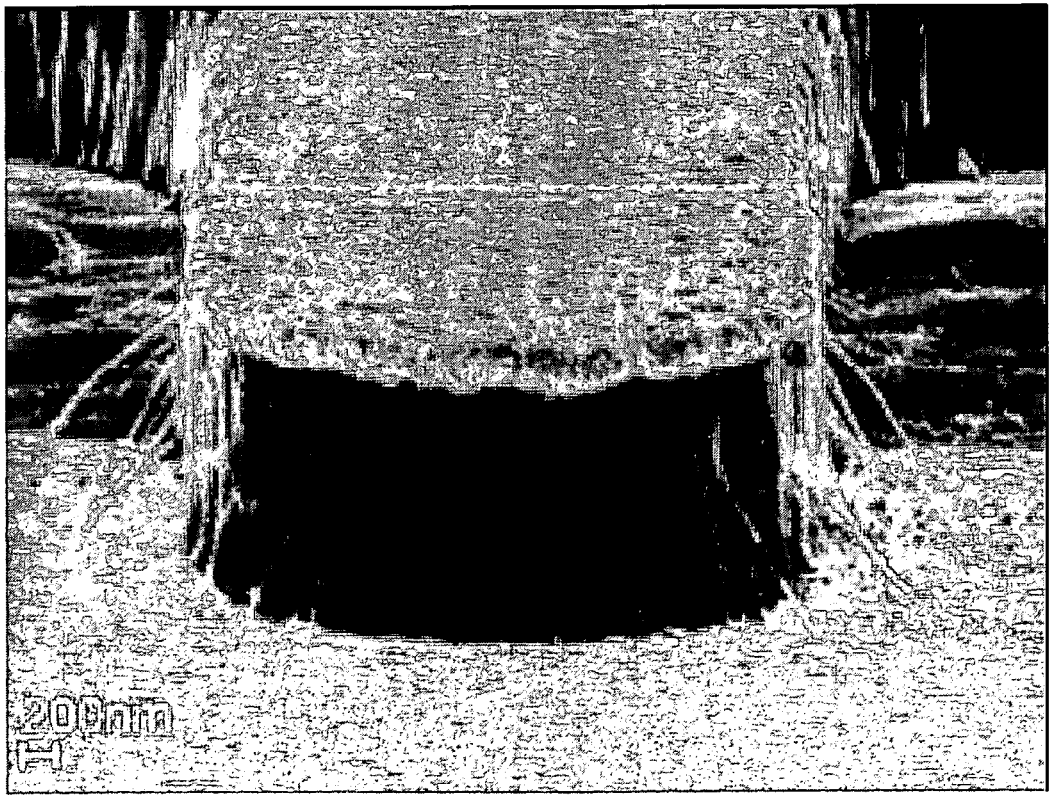
FIG. 9B is a scanning electron micrograph of a nanotube interconnect assembled at 5V p-p.

The density of nanotube bundles formed under the conditions in Example III could be controlled by varying the electric field during dielectrophoresis. As the AC voltage for dielectrophoresis was increased and the oscillation frequency and time of assembly remained constant, the resulting SWNT bundles became denser. This is seen in FIG. 9. FIG. 9A shows a thermosensor produced using 10V p-p, while FIG. 9B shows a similar thermosensor produced using 5V p-p. The density of nanotube bundles was much higher for the 10V assembly than for the 5V assembly. The density of assembled nanotube bundles was also reflected in the resistance of the interconnect, which decreased with increasing assembly voltage, as shown in FIG. 8. The lower resistance of the higher density bundles is consistent with the creation of additional parallel electrically conductive pathways between the microelectrodes.

Example V

Effect of Encapsulation of a Nanotube Interconnect

Figure 7B:
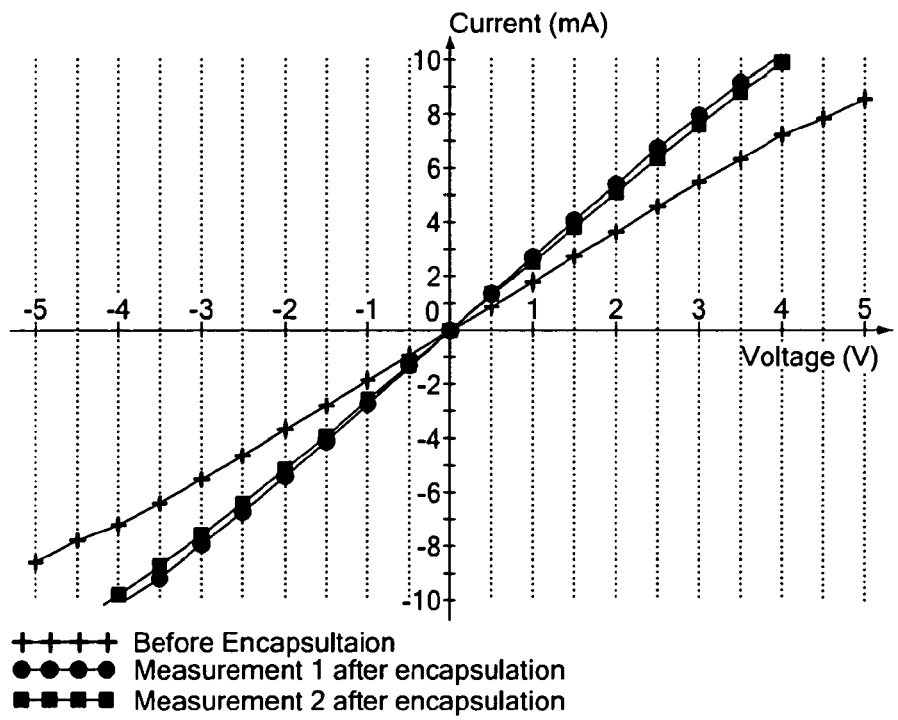

Following assembly of the SWNT thermal sensor of Example III, the SWNT interconnect was encapsulated with a 1 µm parylene-C layer. A third mask was used to open contacts in the encapsulating parylene layer to permit access to the microelectrodes. I-V measurements were conducted to ensure the connectivity between the electrodes and to gauge the effect of encapsulation of the assembled nanotubes in a dielectric material. FIG. 7B illustrates the I-V measurement taken from a sample single electrode device before and after encapsulation. Encapsulation of the SWNT sensor improves the two-terminal resistance.

While the present invention has been described in conjunction with a preferred embodiment, one of ordinary skill in the art, after reading the foregoing specification, will be able to effect various changes, substitutions of equivalents and other alterations to the compositions and articles set forth herein. It is therefore intended that the protection granted by Letter Patent hereon be limited only by the definitions contained in the appended claims and equivalents thereof.

REFERENCES

[1] M. Washizu and O. Kurosawa, "Electrostatic Manipulation of DNA in Microfabricated Structures", *IEEE Trans. on Indust. Appl.*, vol. 26, pp. 1165-1172, 1990.

[2] T. Ono, H. Miyashita, K. Iwami, S. J. Kim, Y. C. Lin and M. Esashi, "Nano/Micromechanical Tools for Nanoscience and Nanoengineering", *Proc. of Int. Symp. Micro-Nanomechatronics and Human Science*, pp. 39-46, 2004.

[3] L. Sun, F. Banhart, A. V. Krasheninnikov, J. A. Rodriguez-Manzo, M. Terrones and P. M. Ajayan, "Carbon Nanotubes as High-Pressure Cylinders and Nanoextruders", *Science*, vol. 312, pp. 1199-1202, 2006.

[4] T. Fukuda, F. Arai and L. Dong, "Assembly of Nanodevices with Carbon Nanotubes through Nanorobotic Manipulations", *Proc. of IEEE*, vol. 91, pp. 1803-1818, 2003.

[5] F. Kreupl, A. P. Graham, G. S. Duesberg, W. Steinhogl, M. Liebau, E. Unger and W. Honlein, *Microelectron. Eng*, vol. 64, pp. 399-408, 2002

[6] I. Amlani, A. M. Rawlett, L. A. Nagahara and R. K. Tsui, "An Approach to transport measurements of electronic molecules", *Appl. Phys. Letters*, vol. 80, pp. 2761-2763, 2002.

[7] R. Kretschmer and W. Fritzsche, "Manipulation of metal nanoparticles in micrometer electrode gaps by dielectrophoresis", *American Inst. of Phys. Conf Proc.*, vol. 725, pp. 85-87, 2004.

[8] H. A. Pohl, *Dielectrophoresis: The Behavior of Neutral Matter in Nonuniform Electric Fields*. New York: Cambridge Univ. Press, 1978.

What is claimed is:

1. A nanoscale three-dimensional circuit interconnect comprising:
    first and second microelectrodes in a vertically displaced non-coplanar arrangement, the first and second microelectrodes having conductive surfaces facing in substantially the same direction; and
    a nanoelement bridge attached at a first end to the conductive surface of the first microelectrode and attached at a second end to the conductive surface of the second microelectrode, the bridge consisting essentially of dielectrophoretically assembled nanoparticles or nanotubes.

2. The circuit interconnect of claim 1, wherein the first and second microelectrodes are vertically separated by a dielectric layer.

3. The circuit interconnect of claim 1, wherein the first microelectrode is deposited on a substrate.

4. The circuit interconnect of claim 1, wherein the bridge consists essentially of dielectrophoretically assembled gold nanoparticles or single walled carbon nanotubes.

5. The circuit interconnect of claim 1, wherein the nanoelements are electrically conductive, are semiconductors, or are non-conductive.

6. The circuit interconnect of claim 1, wherein the conductive surfaces of the first and second microelectrodes are separated from each other at the location of said bridge by a gap of at least 200 nm.

7. The circuit interconnect of claim 1, wherein the nanoelement bridge is electrically conductive and has a resistance of 10 ohms to 1000 ohms.

8. The circuit interconnect of claim 1, wherein the nanoelement bridge is in the form of one or more bundles, clusters, webs, or sheets of said assembled nanoparticles or nanotubes.

9. The circuit interconnect of claim 1, wherein the circuit interconnect has the property of decreasing resistance with increasing temperature.

10. A microfabricated structure comprising one or more nanoscale three-dimensional circuit interconnects according to claim 1.

11. An electronic circuit component comprising one or more nanoscale three-dimensional circuit interconnects according to claim 1.

12. The circuit component of claim 11, wherein the circuit component is a transistor, an integrated circuit, a logic device, a sensor, or a field emitter.

13. The circuit component of claim 12, wherein the circuit component is a transistor and the nanoelements used to form the circuit interconnect are semiconducting or non-conducting.

14. The circuit interconnect of claim 4, wherein the bridge consists essentially of gold nanoparticles.

15. The circuit interconnect of claim 4, wherein the bridge consists essentially of single walled carbon nanotubes.

* * * * *